United States Patent [19]

Porter

[11] Patent Number: 4,967,832
[45] Date of Patent: Nov. 6, 1990

[54] COOLING METHOD AND APPARATUS FOR INTEGRATED CIRCUIT CHIPS

[75] Inventor: Warren W. Porter, Escondido, Calif.
[73] Assignee: NRC Corporation, Dayton, Ohio
[21] Appl. No.: 457,640
[22] Filed: Dec. 27, 1989
[51] Int. Cl.$^5$ ............................................. F28D 15/00
[52] U.S. Cl. .................................. 165/104.32; 62/434; 361/385
[58] Field of Search ................. 62/430, 434, 435, 436, 62/438; 237/66; 361/385; 165/104.32, 917

[56] References Cited

U.S. PATENT DOCUMENTS

| | | | |
|---|---|---|---|
| 2,341,058 | 2/1944 | Paluev | 174/14 |
| 3,098,891 | 7/1963 | Delguste | 174/15 |
| 3,570,762 | 3/1971 | Wanson | 237/66 |
| 3,817,321 | 6/1974 | von Cube et al. | 165/105 |
| 3,989,102 | 11/1976 | Jaster et al. | 165/107 |
| 4,302,793 | 11/1981 | Rohner | 361/385 |
| 4,437,082 | 3/1984 | Walsh et al. | 336/58 |
| 4,513,346 | 4/1985 | Devins | 361/385 X |
| 4,879,632 | 11/1989 | Yamamoto et al. | 361/385 X |

OTHER PUBLICATIONS

IBM Technical Disclosure Bulletin, vol. 17, No. 3, Aug. 1974, pp. 884 & 885, "Liquid Cooled Electronic Components for Low-End Machines", Cunavellis et al.

*Primary Examiner*—William E. Tapolcai
*Attorney, Agent, or Firm*—Wilbert Hawk, Jr.; Stephen F. Jewett; Gregory P. Gadson

[57] ABSTRACT

A method and apparatus for lowering integrated circuit chip ambient temperatures uses negative pressure to induce cooling liquid flow, rather than prior art positive pressure approaches, thereby preventing undesirable cooling liquid leakage outside of the cooling region. The cooling liquid is deaerated to eliminate performance degrading air bubbles, which are a by-product of the negative pressure approach.

9 Claims, 4 Drawing Sheets

LIQUID FROM MANIFOLD 114 → ↑   ↓ ← LIQUID TO MANIFOLD 144

COOLING METHOD AND APPARATUS FOR INTEGRATED CIRCUIT CHIPS

FIELD OF THE INVENTION

The present invention generally relates to integrated circuit (IC) chip cooling methods and apparatuses. More specifically, the present invention relates to a method and apparatus for liquid cooling of an IC chip without cooling fluid leakage associated with prior art methods.

BACKGROUND OF THE INVENTION

It is known that, with respect to CMOS technology, lower temperatures cause an IC chip to operate at a higher frequency because of increased carrier mobility. To that end, thermo-electric cooling methods have been used to improve CMOS IC chip operating speed, where an increase is desired. (See U.S. patent application Ser. No. 457,641, having NCR Docket Number 4432, and titled METHOD AND APPARATUS FOR LOW TEMPERATURE INTEGRATED CIRCUIT CHIP TESTING AND OPERATION, and filed concurrently with the present application, which application is also assigned to the assignee of the present patent application, and hereby expressly incorporated by reference.) The aforementioned patent application teaches that cooling can be used to increase the operating speed of an existing CMOS IC chip, in order to simulate the operation of a faster, but yet unavailable IC chip.

In addition to using liquid cooling for chip testing and simulation purposes, liquid cooling methods can be used to increase the operating speed of actual CMOS IC chips during normal operation. Liquid cooling methods can also be used to simply withdraw excess heat generated by the circuits in high-throughput IC chips.

In contrast to CMOS circuits, emitter-coupled logic (ECL) circuits increase their operating speed with an increase in operating temperature. However, excessive temperatures (greater than approximately 85 degrees Celsius) can cause burnout of an ECL circuit. Therefore, ECL circuits must be properly cooled to maintain a satisfactory mean time between failure.

A problem in prior art thermo-electric cooling methods is that cooling liquid often leaks onto unintended components during normal operation, mostly caused by the cooling liquid being pumped into the cooling region surrounding the targeted IC chip, and seeping through cooling region crevices.

SUMMARY OF THE INVENTION

To that end, it is an object of the present invention to provide a method and apparatus for liquid-cooling of an IC chip without unwanted leakage of the cooling fluid.

It is also an object of the present invention to prevent leakage of the cooling fluid by utilizing negative pressure.

It is an additional object to eliminate air bubbles which may enter into the cooling apparatus/system and degrade performance when negative pressure is employed.

There is provided in accordance with the present invention, a cooling arrangement for cooling an electronic component (here, an IC chip) including a cooling chamber connected to the electronic component, the chamber having a chamber input and a chamber output, and a negative pressure pump having a pump input and a pump output, connected to the chamber output via the pump input for drawing cooling fluid through the chamber input and into the cooling chamber to remove heat from the electronic component, and out of the chamber output.

There is further provided for the cooling arrangement of the present invention, a fluid recirculator connected to the chamber output, the chamber input and the negative pressure pump, for recirculating the cooling fluid, a heat exchanger connected to the output of the negative pressure pump for removing heat from the cooling fluid. The fluid recirculator contains a deaerator for removing air bubbles from the cooling fluid.

The details of the present invention will be revealed in the following description with reference to the aforementioned drawings.

DESCRIPTION OF THE PREFERRED EMBODIMENT

Figure 1:
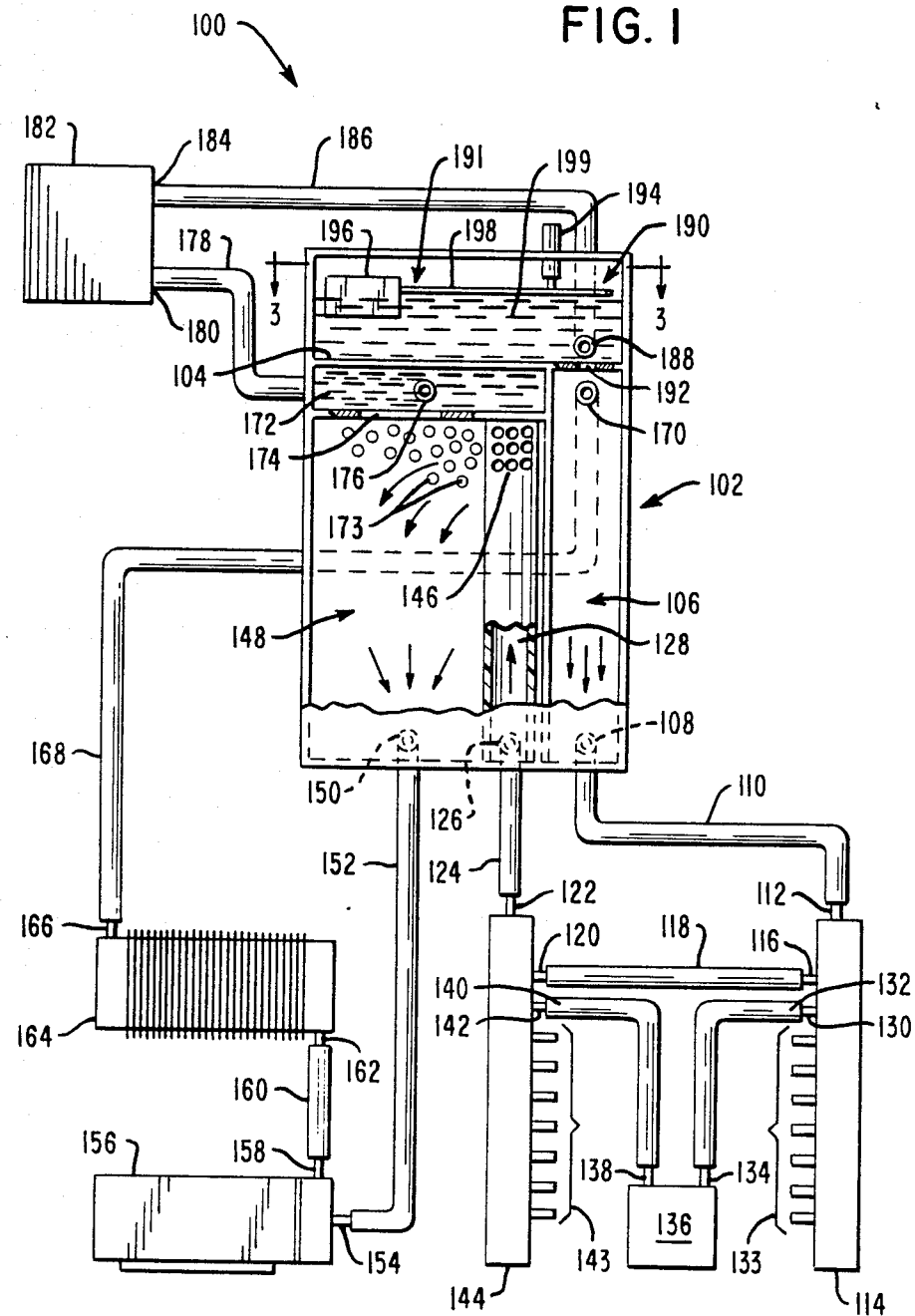
FIG. 1 is a diagram of the IC chip cooling system of the present invention.

The chip cooling arrangement 100 in FIG. 1 achieves the objects of the present invention, and is capable of keeping the operating temperature between 70 and 80 degrees Fahrenheit. The major components of the cooling arrangement 100 are: a cooling fluid reservoir 102 (which is used to recirculate cooling fluid and deaerate it in the process) connected to input and output manifolds 114 and 144; a cooling chamber 136 connected between the manifolds 114 and 144 and containing an electronic component (an IC chip in the preferred embodiment) to be cooled; a centrifugal pump 156 (hereafter, "negative pressure pump") connected to create negative pressure in the cooling fluid reservoir 102 and a heat exchanger 164 (also connected to the cooling fluid reservoir 102); and a transfer pump 182, also connected to the cooling fluid reservoir 102. The cooling fluid is either deionized or distilled water in the preferred embodiment.

During the following description, it should be initially noted that the negative pressure pump 156 is primarily responsible for drawing the cooling fluid (or cooling liquid in the preferred embodiment) through the cooling circuit. Describing the cooling circuit, cooling fluid in an ambient pressure compartment 106 flows down and out of the cooling fluid reservoir through a port 108, and then flows into the manifold 114 via hose 110 and manifold inlet 112. The manifold 114 directs the cooling fluid through an outlet 130, a hose 132, and into the cooling chamber 136 which contains the electronic component to be cooled (not shown) via inlet 134. After removing heat from the electronic component the cooling fluid exits the cooling chamber 136 via an outlet 138 and a hose 140 into the second manifold 144 via an inlet 142. The cooling fluid then goes back to the cooling fluid reservoir 102 via a manifold outlet 122 and a hose 124.

The manifolds 114 and 144 have several outlets 133 and inlets 143, respectively, which allow several cooling chambers in addition to the chamber 136 to be placed in the cooling circuit, and thereby simultaneously cool several electronic components. Also connected between the two manifolds 114 and 144 at ports 116 and 120 is an air transfer tube 118, for routing fluid which has not been completely deaerated, away from the cooling chamber 136, so as not to degrade the cooling process.

The cooling fluid in the hose 124 enters (via port 126) a vertical tube (or air bubble separator) 128 inside of a low pressure compartment 148. The vertical tube 128 has perforations 146 which slow the flow of rising cooling fluid, and separate air bubbles from the cooling fluid. Deaerated cooling fluid flows down to the outlet 150, while air bubbles 173 from aerated cooling fluid flow through an aperture 174 into an air entrapment compartment 172.

The cooling fluid from the low pressure compartment 148 is drawn into the negative pressure pump 156 through port 150 via a hose 152 and a pump inlet 154. The pump then sends the cooling fluid (via outlet 158, hose 160 and inlet 162) to the heat exchanger 164, where excess heat absorbed by the fluid from the electronic component is removed. The heat exchanger 164 is a refrigeration system in the preferred embodiment. Its temperature having been lowered, the cooling fluid is sent back to the ambient pressure compartment 106 (via outlet 166, hose 168 and ambient pressure compartment inlet 170), where it begins the cooling circuit anew.

The entrapped air in the air entrapment compartment 172 is transferred to an air escape compartment 190 by the transfer pump 182. The transfer pump 182 is connected to the air entrapment compartment 172 via its inlet 180, a hose 178 and the air entrapment compartment outlet 176. It is also connected to the air escape compartment 190 via its outlet 184, a hose 186 and an air escape compartment inlet 188. The air escape compartment has an air escape valve 194 which allows air in the cooling fluid to escape, provided the fluid level 199 in that compartment is not too high. Thus the air escape valve 194 is open to allow air to escape unless the amount of fluid in the air escape compartment is such that it would begin to spill through the open valve. A styrofoam float 196 and float arm 198 together form a float assembly 191, which controls the operation of the air escape valve 194. The operations of the air escape compartment 190 and its air escape valve are more fully explained below with reference to FIGS. 3-5.

Figure 2:
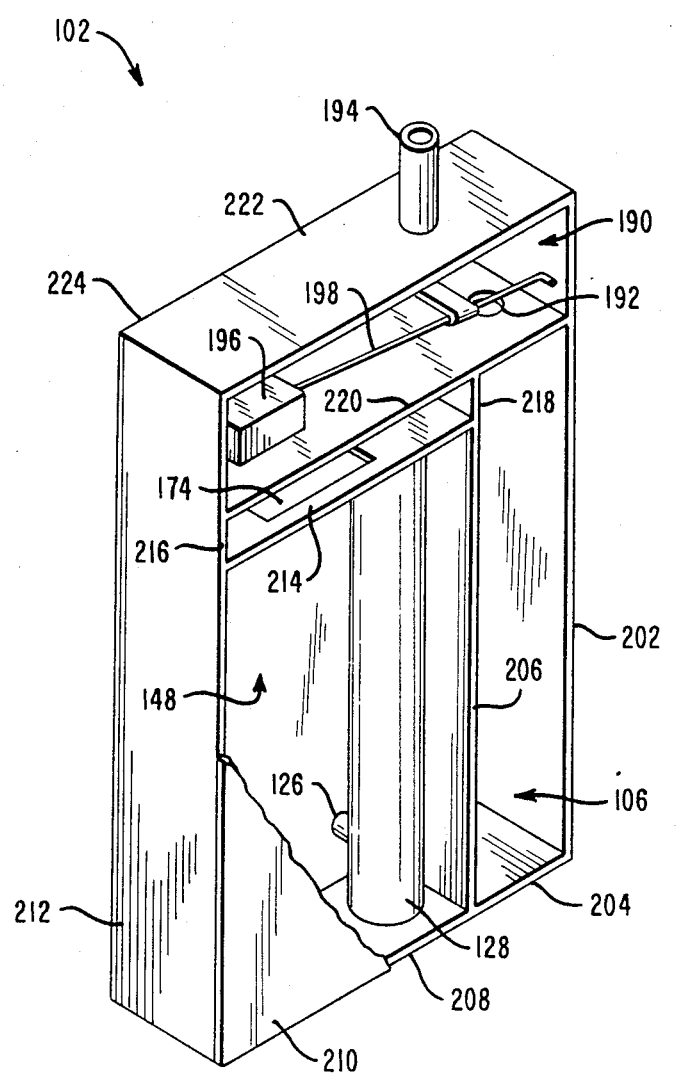
FIG. 2 is an isometric view of a cooling fluid reservoir used in the cooling system of FIG. 1.

FIG. 2 is an isometric view of the cooling fluid reservoir 102 already described with respect to FIG. 1. The components numbered 202-224 are merely walls separating the previously described compartments, and those necessary to enclose the reservoir. The various compartments of the cooling fluid reservoir 102 are separated by transparent acrylic sheets measuring 0.25 inches thick in the preferred embodiment, so that the internal operation of the cooling fluid reservoir can be observed. It will be appreciated by those skilled in the art that the compartment walls are not limited to the aforementioned specifications.

Figure 3:
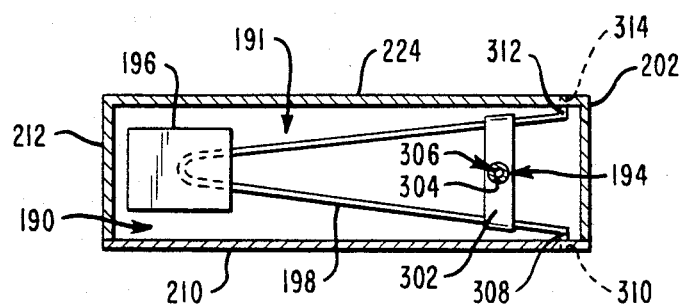
FIG. 3 is a cross-sectional top view taken along the line 3—3 in FIG. 1, of the cooling fluid reservoir in FIG. 2.
Figure 4:
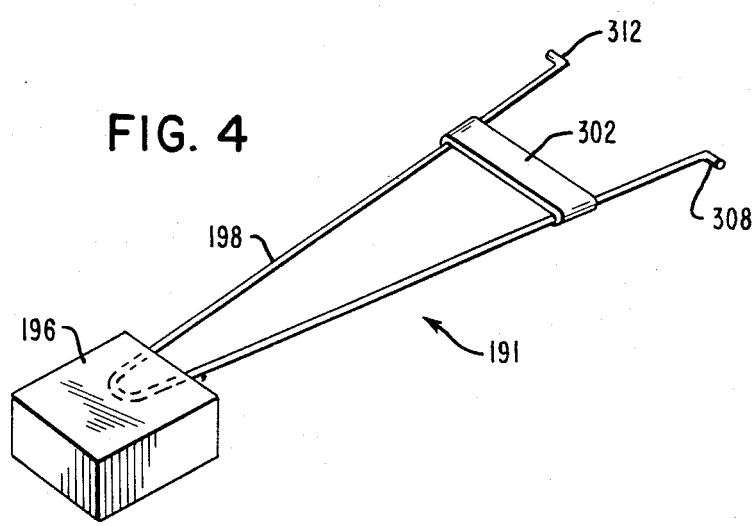
FIG. 4 is an isometric view of a float assembly used in the cooling fluid reservoir in FIG. 2.

Turning now to FIGS. 3 and 4, the float assembly 191 is shown hingedly connected to the air escape compartment 190 walls. The float arm 198 has two stems 308 and 312 which are plugged into the holes 310 and 314 of the walls 210 and 224, respectively. The float arm 198 rotates freely in the holes 310 and 314. Any number of materials having a specific gravity less than the cooling fluid can be used for the float 196, while the float arm is a brass wire frame in the preferred embodiment. A bridge 302 is attached to the float arm 198 and contacts the bottom of a valve tube 306 which is slidably placed inside of a valve body 304 of the air escape valve 194.

Figure 5:
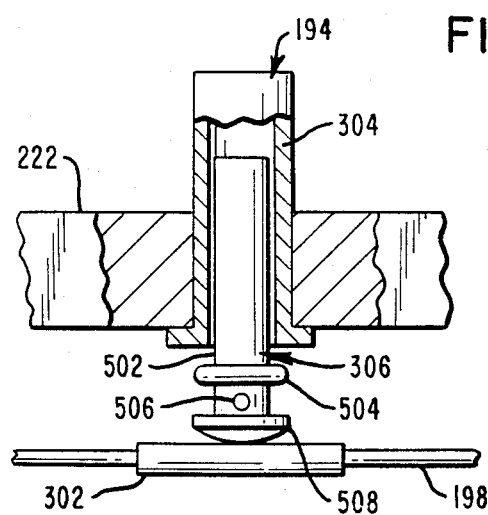
FIG. 5 is a cross-sectional side view of a float valve and float valve tube used in the cooling fluid reservoir in FIG. 2.

FIG. 5 shows the air escape valve in greater detail embedded in the wall 222 of the cooling fluid reservoir 102. The valve tube 306 has a hollow stem portion 502 which has an "O" ring 504 mounted thereon which serves as a valve seal when necessary. The valve stem 502 also contains air escape holes such as the one 506 which allow air bubbles to escape therethrough, in addition to escaping through the tolerance space between the stem 502 and the valve body 304. A plastic component 508 serves as a tube end seal and a convex float bearing (to provide a sliding interface with the bridge 302.

During operation of the system 100, as the fluid level 199 rises caused by increased aeration, the float 196 rises therewith, causing the float arm 198 and the bridge 302 to raise the valve stem 502. When the fluid level 199 is unacceptably high, the "O" ring 504 will contact the bottom of the valve body 304 and thus seal off the primary means of air escape. When the fluid level 199 returns to normal, the "O" ring 504 will be lowered to return the air escape valve 194 to normal operation.

Entry of air into the cooling fluid is possible, for example, when faulty seals or broken tubes are present in the system 100, when adding or changing an electronic component to be cooled, or when the system 100 is initially filled with cooling fluid. While the air escape valve 194 is closed, the cooling fluid is continually circulated to cool the electronic component. The valve does not re-open until the problem (causing heavy aeration) is corrected.

Figure 6:
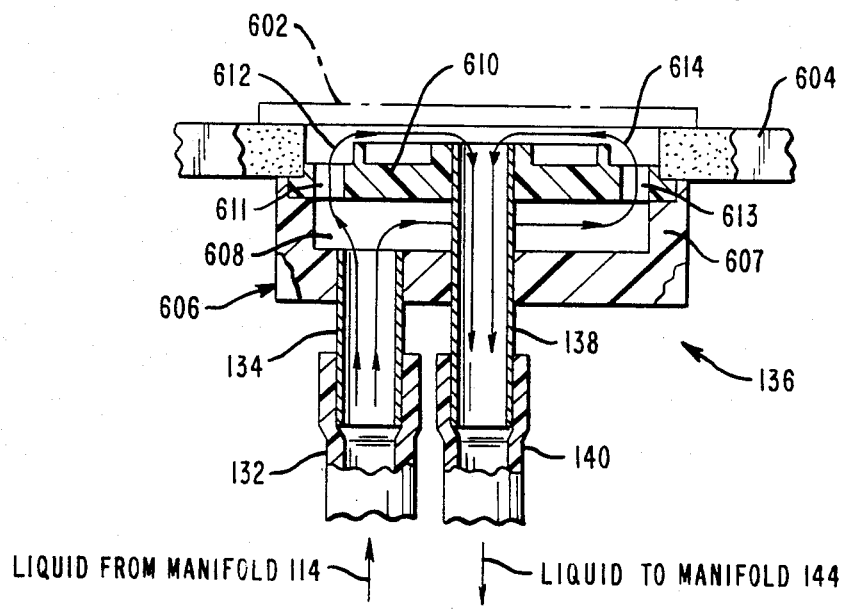
FIG. 6 is a cross-sectional view of a cooling chamber, with an attached IC chip (to be cooled) shown in phantom.

FIG. 6 shows an example of a cooling chamber 136, suitable for use with the present cooling system 100. The cooling chamber 136 is attached to the surface of an IC chip 602 (which is to have heat removed) via a ceramic substrate 604. The ceramic substrate 604 is attached to a plastic manifold 606 formed by upper and lower parts 610 and 607, respectively, which manifold 606 is also attached to the metal tubes 134 and 138 as shown. As is consistent with FIG. 1, the metal tubes 134 and 138 are attached to the flexible hoses 132 and 140, which are in turn attached to the manifolds 114 and 144, respectively.

Figure 7:
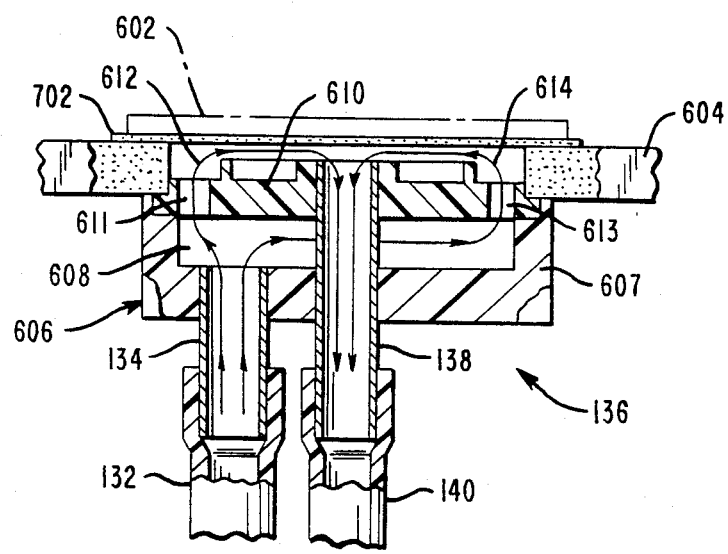
FIG. 7 is a cross-sectional view of the cooling chamber in FIG. 6 with an optional ceramic bridge between the cooling chamber and the IC chip.

The upper part 610 has eight holes around its periphery, which permit cooling fluid to leave the cooling fluid cavity 608 and contact the surface of the IC chip 602. Two of the holes—611 and 613—are shown in FIGS. 6 and 7. Sample paths 612 and 614 illustrate two of the many courses the cooling fluid may take in the process of removing heat from the IC chip 602.

The cooling chamber 136 in FIG. 7 is identical to the one in FIG. 6, except that a ceramic bridge 702 is placed between the IC chip 602 and the ceramic substrate 604, when it is desired that the cooling fluid not directly contact the surface of the IC chip 602.

Thus, a cooling system 100 has been described which novelly employs negative pressure to move cooling fluid around the cooling circuit, and which maintains high cooling efficiency and performance by eliminating performance degrading air bubbles which are a natural consequence of negative pressure.

Variations and modifications to the present invention are possible given the above disclosure. However, such variations and modifications are intended to be within the scope of the invention claimed by this letters patent.

We claim:

1. A cooling arrangement for cooling an electronic component comprising:
   a cooling chamber coupled to said electronic component, said chamber having a chamber input and a chamber output;
   a negative pressure pump having a pump input and a pump output, coupled to said chamber output via said pump input for drawing cooling fluid through said chamber input and into said cooling chamber to remove heat from said electronic component, and out of said chamber output;
   a fluid recirculator for recirculating said cooling fluid comprising a deaerator for removing air bubbles from said cooling fluid, said fluid recirculator coupled to said chamber output, said chamber input and said negative pressure pump; and
   a heat exchanger coupled to the output of said negative pressure pump for removing heat from said cooling fluid;
   said deaerator comprising:
   a fluid reservoir, said fluid reservoir comprising:
   a low pressure compartment having an upper aperture and at least two lower apertures, coupled at a first lower aperture to said chamber output and at a second lower aperture to said pump input for receiving said cooling fluid from said cooling chamber;
   an air escape compartment having an air escape means, coupled to said upper aperture, for receiving air bubbles and cooling fluid from said low pressure compartment; and
   an ambient pressure compartment coupled to said air escape compartment and coupled to said chamber input, for returning, upon removal of air bubbles by said air escape means, said cooling fluid to said chamber input.

2. The cooling arrangement in claim 1 wherein said air escape means comprises:
   an air escape valve which opens to allow air bubbles to leave said fluid reservoir via said air escape compartment when the cooling fluid level in said air escape compartment is below a predetermined threshold level, and said air escape valve closes when said cooling fluid level is equal to or greater than said threshold level.

3. The cooling arrangement in claim 2 wherein said air escape means further comprises a float assembly coupled to said air escape valve and having a float coupled to a float arm, said float raising and lowering said float arm in response to said cooling fluid level, and said float arm operatively coupled to said air escape valve to open said escape valve when said cooling fluid level is below said threshold and close said air escape valve when said cooling fluid level is equal to or greater than said threshold.

4. The cooling arrangement in claim 3 wherein said air escape compartment has a first and a second region, said first region being directly coupled to said low pressure compartment and said second region being operatively coupled to said air escape means and said ambient pressure compartment.

5. The cooling arrangement in claim 4 further comprising:
   a second pump coupled between said first and second regions for transferring air bubbles and fluid from said first region to said second region.

6. The cooling arrangement in claim 5 wherein said low pressure compartment comprises an air bubble separator for separating said air bubbles from circulating cooling fluid.

7. The cooling arrangement in claim 6 wherein said air bubble separator comprises a vertical tube coupled to said chamber output and having perforations, for causing a slowing of said cooling fluid/air bubble mixture, and allowing said air bubbles to rise to said air escape compartment, while bubble-free cooling fluid falls toward said second lower aperture of said low pressure compartment, said second lower aperture being coupled to the input of said negative pressure pump, and said air bubble separator being coupled to said first lower aperture.

8. The cooling arrangement in claim 7 further comprising:
   a first manifold coupled between said ambient pressure compartment and said chamber input; and
   a second manifold coupled between said chamber output and said low pressure compartment, said first and second manifolds connectable to a plurality of cooling chambers so that said cooling arrangement can cool a plurality of electronic components.

9. The cooling arrangement in claim 8 further comprising:
   an air transfer tube coupled between said first and second manifolds, and not to said cooling chamber, for removing air bubbles in said first manifold before said cooling fluid reaches said cooling chamber.

* * * * *

UNITED STATES PATENT AND TRADEMARK OFFICE
CERTIFICATE OF CORRECTION

PATENT NO. : 4,967,832

DATED : November 6, 1990

INVENTOR(S) : Warren W. Porter

It is certified that error appears in the above-identified patent and that said Letters Patent is hereby corrected as shown below:

On the title page:
Change "[73] Assignee: NRC Corporation, Dayton, Ohio" to -- [73] Assignee: NCR Corporation, Dayton, Ohio--

Signed and Sealed this

Seventeenth Day of March, 1992

Attest:

HARRY F. MANBECK, JR.

*Attesting Officer*     *Commissioner of Patents and Trademarks*